(12) United States Patent
Huang et al.

(10) Patent No.: US 10,867,951 B2
(45) Date of Patent: *Dec. 15, 2020

(54) SEMICONDUCTOR DEVICE

(71) Applicant: TAIWAN SEMICONDUCTOR MANUFACTURING COMPANY LTD., Hsinchu (TW)

(72) Inventors: Kuan-Yu Huang, Taipei (TW);
Tzu-Kai Lan, Yilan County (TW);
Shou-Chih Yin, Taipei (TW);
Shu-Chia Hsu, Hsinchu (TW);
Pai-Yuan Li, Taichung (TW);
Sung-Hui Huang, Yilan County (TW);
Hsiang-Fan Lee, Hsinchu (TW);
Ying-Shin Han, Hsin Chu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/385,399

(22) Filed: Apr. 16, 2019

(65) Prior Publication Data
US 2019/0244925 A1    Aug. 8, 2019

Related U.S. Application Data

(63) Continuation of application No. 15/687,943, filed on Aug. 28, 2017, now Pat. No. 10,340,242.

(51) Int. Cl.
*H01L 23/00* (2006.01)
*H01L 23/498* (2006.01)
(Continued)

(52) U.S. Cl.
CPC .......... *H01L 24/17* (2013.01); *H01L 21/4853* (2013.01); *H01L 23/49816* (2013.01);
(Continued)

(58) Field of Classification Search
CPC ..... H01L 2224/1703; H01L 2224/1403; H01L 2224/0603
See application file for complete search history.

(56) References Cited

U.S. PATENT DOCUMENTS

2007/0290345 A1* 12/2007 Clevenger .............. H01L 23/13
257/738
2013/0087910 A1* 4/2013 Abdul Razak .......... H01L 24/14
257/737

(Continued)

*Primary Examiner* — Dung A. Le
(74) *Attorney, Agent, or Firm* — WPAT, P.C., Intellectual Property Attorneys; Anthony King

(57) ABSTRACT

A semiconductor device includes an electronic component, a package, a substrate and a plurality of first conductors and second conductors. The package is over the electronic component. T substrate is between the electronic component and the package. The substrate includes a first portion covered by the package, and a second portion protruding out of an edge of the package and uncovered by the package. The first conductors and second conductors are between and electrically connected to the electronic component and the substrate. A width of a second conductor of the plurality of second conductors is larger than a width of a first conductor of the plurality of first conductors, the first conductors are disposed between the second portion of the substrate and the electronic component, and the second conductors are disposed between the first portion of the substrate and the electronic component.

20 Claims, 25 Drawing Sheets

(51) Int. Cl.
*H01L 21/48* (2006.01)
*H01L 25/18* (2006.01)
*H01L 25/03* (2006.01)
*H01L 25/065* (2006.01)

(52) U.S. Cl.
CPC ............. *H01L 24/06* (2013.01); *H01L 24/11* (2013.01); *H01L 24/13* (2013.01); *H01L 24/14* (2013.01); *H01L 25/03* (2013.01); *H01L 25/18* (2013.01); *H01L 25/0655* (2013.01); *H01L 25/0657* (2013.01); *H01L 2224/0603* (2013.01); *H01L 2224/10126* (2013.01); *H01L 2224/10145* (2013.01); *H01L 2224/11013* (2013.01); *H01L 2224/11502* (2013.01); *H01L 2224/11849* (2013.01); *H01L 2224/13021* (2013.01); *H01L 2224/13022* (2013.01); *H01L 2224/13082* (2013.01); *H01L 2224/13111* (2013.01); *H01L 2224/13113* (2013.01); *H01L 2224/13116* (2013.01); *H01L 2224/13139* (2013.01); *H01L 2224/13147* (2013.01); *H01L 2224/1403* (2013.01); *H01L 2224/14051* (2013.01); *H01L 2224/14135* (2013.01); *H01L 2224/14136* (2013.01); *H01L 2224/14177* (2013.01); *H01L 2224/14505* (2013.01); *H01L 2224/16111* (2013.01); *H01L 2224/16112* (2013.01); *H01L 2224/16145* (2013.01); *H01L 2224/16227* (2013.01); *H01L 2224/1703* (2013.01); *H01L 2224/17181* (2013.01); *H01L 2224/17505* (2013.01); *H01L 2224/81191* (2013.01); *H01L 2224/81815* (2013.01); *H01L 2225/06513* (2013.01); *H01L 2225/06517* (2013.01); *H01L 2924/15311* (2013.01); *H01L 2924/18161* (2013.01); *H01L 2924/3841* (2013.01)

(56) References Cited

U.S. PATENT DOCUMENTS

| | | | | |
|---|---|---|---|---|
| 2013/0214426 | A1* | 8/2013 | Zhao | H01L 23/5385 257/774 |
| 2013/0270698 | A1* | 10/2013 | Chen | H01L 24/06 257/738 |
| 2016/0260680 | A1* | 9/2016 | Sakata | H01L 24/75 |

* cited by examiner

SEMICONDUCTOR DEVICE

CROSS REFERENCE TO RELATED APPLICATIONS

This application is a continuation of application Ser. No. 15/687,943, filed on Aug. 28, 2017, now allowed, which is incorporated by reference in its entirety.

BACKGROUND

In the packaging of integrated circuits, semiconductor dies may be stacked through bonding, and may be bonded to other package components such as interposers and package substrates. The resulting packages are known as Three-Dimensional Integrated Circuits (3DICs). Cold joint and bridging issues, however, are challenges in the 3DICs.

BRIEF DESCRIPTION OF THE DRAWINGS

Aspects of the embodiments of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
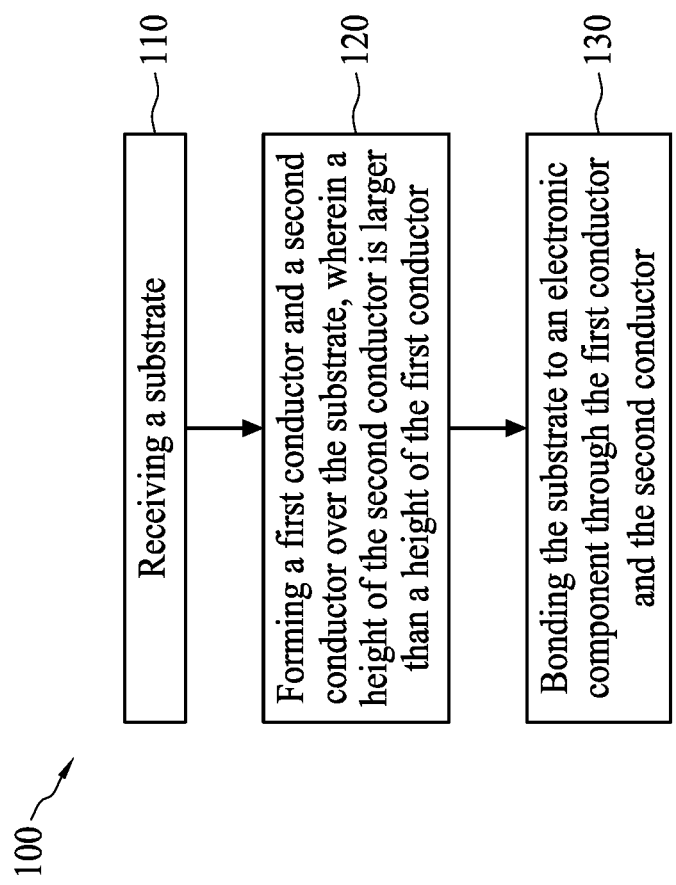
FIG. 1 is a flow chart illustrating a method of manufacturing a semiconductor device according to various aspects of one or more embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "above", "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first", "second" and "third" describe various elements, components, regions, layers and/or sections, these elements, components, regions, layers and/or sections should not be limited by these terms. These terms may be only used to distinguish one element, component, region, layer or section from another. The terms such as "first", "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Other features and processes may also be included. For example, testing structures may be included to aid in the verification testing of the 3D packaging or 3DIC devices.

The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In some embodiments of the present disclosure, a semiconductor device includes two or more types of conductors disposed at the same tier having different volumes and/or widths formed at different regions of a substrate to respectively alleviate cold joint issue and bridging issue.

FIG. 1 is a flow chart illustrating a method of manufacturing a semiconductor device according to various aspects of one or more embodiments of the present disclosure. The method 100 begins with operation 110 in which a substrate is received. The method proceeds with operation 120 in which first conductors and second conductors are formed over the substrate. The height of the second conductor is larger than the height of the first conductor. The method proceeds with operation 130 in which the substrate is bonded to an electronic component through the first conductors and the second conductors.

The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the method.

Figure 2A:
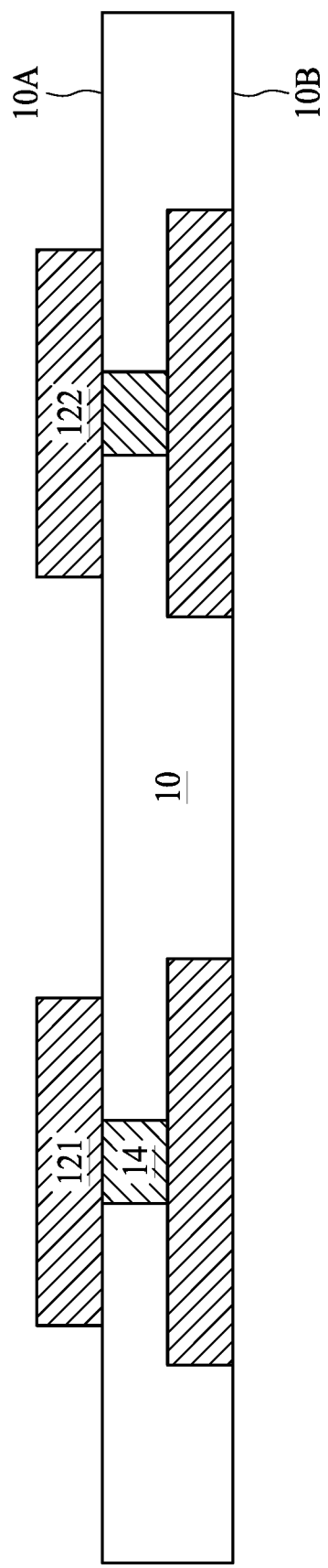
FIG. 2A, FIG. 2B, FIG. 2C and FIG. 2D are schematic views at one of various operations of manufacturing a semiconductor device according to one or more embodiments of the present disclosure.

FIG. 2A, FIG. 2B, FIG. 2C and FIG. 2D are schematic views at one of various operations of manufacturing a semiconductor device according to one or more embodiments of the present disclosure. As depicted in FIG. 2A, a substrate 10 is received. In some embodiments, the substrate 10 may include a wafer, a semiconductor substrate, an interposer, a package substrate or the like. The substrate 10 includes a first surface 10A, and a second surface 10B opposite to the first surface 10A. In some embodiments, a first bonding pad 121 and a second bonding pad 122 are formed on the substrate 10 and exposed from the first surface 10A. The first bonding pad 121 and the second bonding pad 122 may be configured to receive and electrically connect to conductors to be formed. In some alternative embodiments, the first bonding pad 121 and the second bonding pad 122 may be exposed from the second surface 10B. In some embodiments, the substrate 10 may further include one or more circuit layers 14 such as redistribution layers (RDLs), conductive vias or the like electrically connected to the first bonding pad 121 and the second bonding pad 122.

Figure 2B:
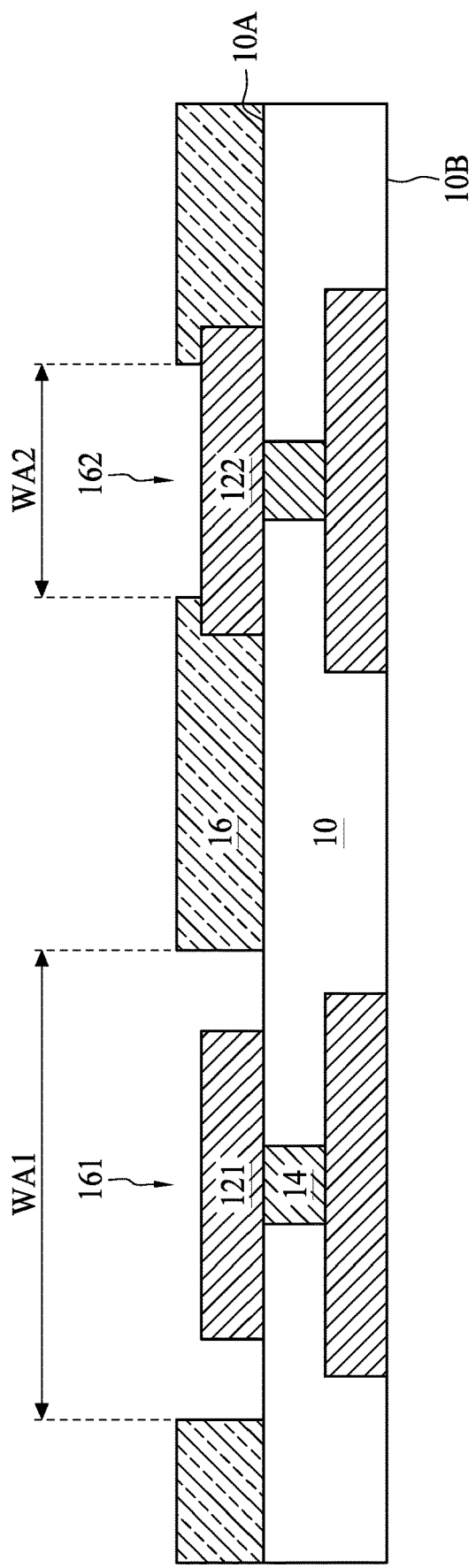

As depicted in FIG. 2B, a passivation layer 16 is formed over the substrate 10. In some embodiments, the passivation layer 16 is formed over the first surface 10A of the substrate 10. In some embodiments, the passivation layer 16 may include a solder mask, an insulating layer or the like. The passivation layer 16 includes a first recess 161 and a second recess 162 exposing the first bonding pad 121 and the second bonding pad 122, respectively. In some embodiments, the width WA1 of the first recess 161 is larger than the width WA2 of the second recess 162. In some embodiments, the second recess 162 exposes a portion of the second bonding pad 122, and another portion of the second bonding pad 122 is covered by the passivation layer 16. The first recess 161, on the other hand, may entirely expose the first bonding pad 121, and the first bonding pad 121 may be apart from the passivation layer 16 with a gap.

Figure 2C:
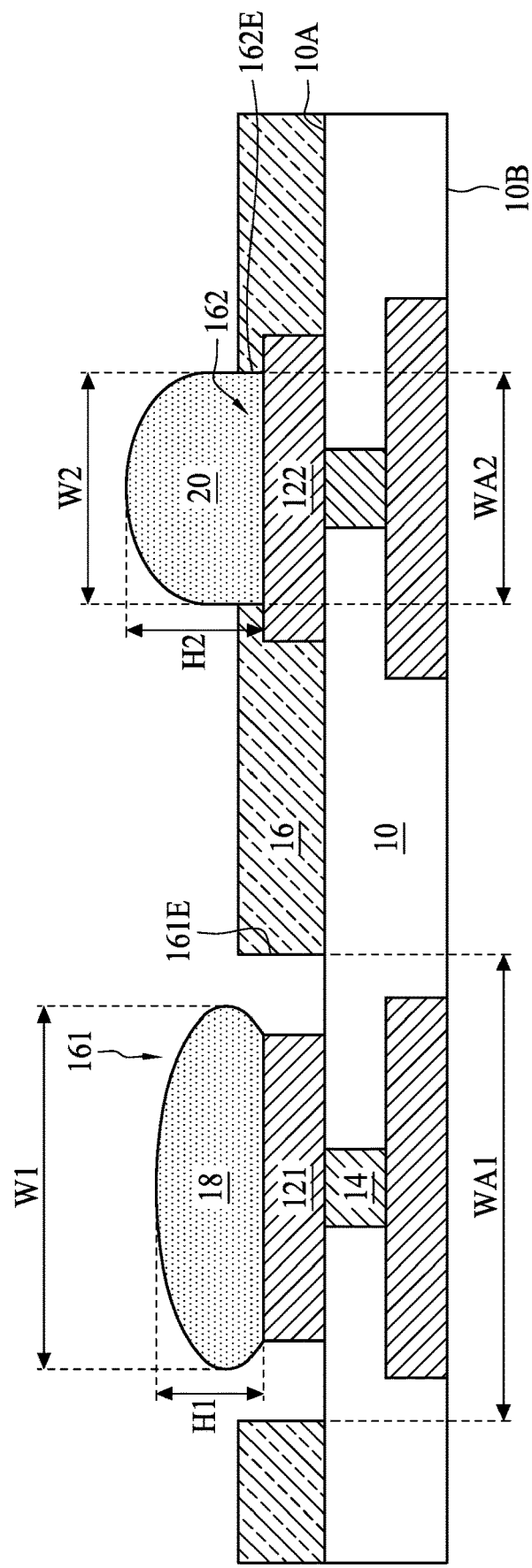

As depicted in FIG. 2C, a conductive material is formed over the first bonding pad 121 and the second bonding pad 122 to form a first conductor 18 through the first recess 161 and to form a second conductor 20 through the second recess 162. In some embodiments, a reflow operation may be performed after formation of the conductive material. In some embodiments, the first conductor 18 and the second conductor 20 may include conductive bumps, conductive balls or the like. In some embodiments, the material of the first conductor 18 and the second conductor 20 may include, but are not limited to, silver (Ag), copper (Cu), tin (Sn), combinations thereof, or other suitable conductive materials. In some embodiments, the first conductor 18 may be non-solder mask defined (NSMD) conductor, while the second conductor 20 may be solder mask defined (SMD) conductor. By way of example, the passivation layer 16 covering a portion of the second bonding pad 122 may help to define the width W2 of the second conductor 20, while the width W1 of the first conductor 18 may be defined by the width of the first bonding pad 121. In some embodiments, the first conductor 18 is apart from an edge 161E of the respective first recess 161, and the second conductor 20 is in contact with an edge 162E of the respective second recess 162. In some embodiments, the volume of the first conductor 18 and that of the second conductor 20 are substantially the same, the height H1 of the first conductor 18 is defined by the width of the first bonding pad 121, and the height H2 of the second conductor 20 is defined by the width WA2 of the second recess 162. Since the width WA2 of the second recess 162 is smaller than the width of the first bonding pad 121, the width W2 of the second conductor 20 is smaller than the width W1 of the first conductor 18, and the height H2 of the second conductor 20 is larger than the height H1 of the first conductor 18. In some embodiments, the height H2 of the second conductor 20 may be larger than the height H1 of the first conductor 18 by about 5% to about 20% e.g., about 10%, but not limited thereto. In some embodiments, the first conductors 18 and the second conductors 20 are substantially disposed at the same tier.

Figure 2D:
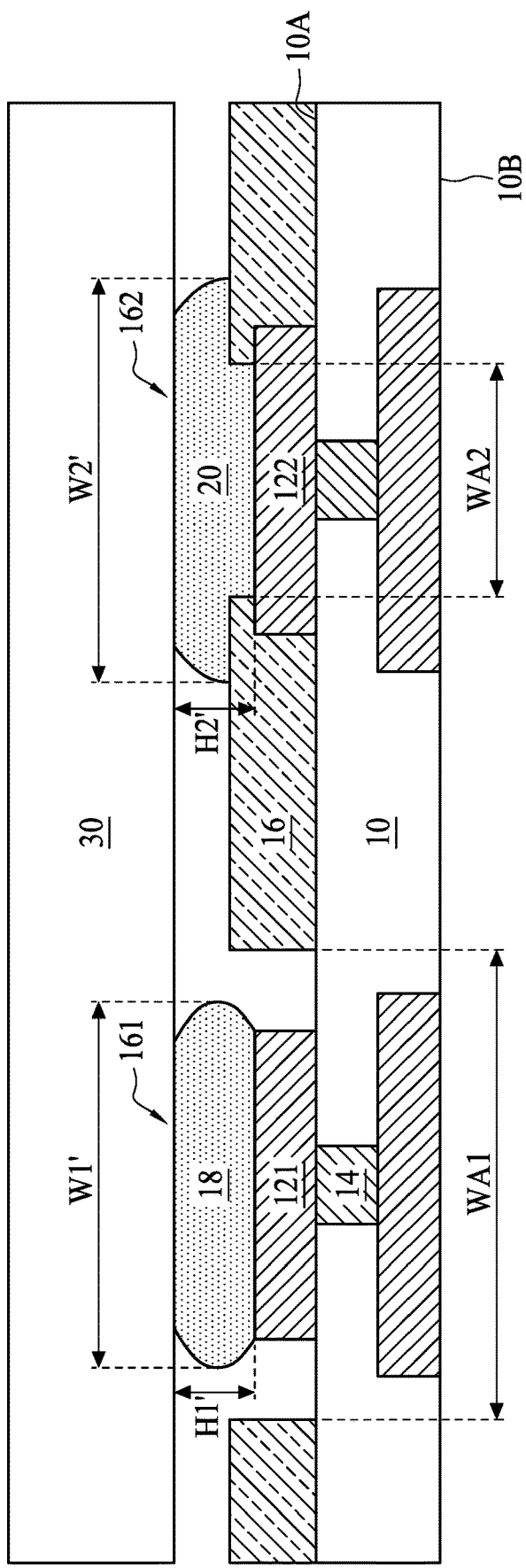

As depicted in FIG. 2D, the substrate 10 may be bonded to an electronic component 30 through the first conductor 18 and the second conductor 20 to form a semiconductor device 1. In some embodiments, the electronic component 30 may include a wafer, a semiconductor substrate, an interposer, a package substrate, a printed circuit board (PCB) or the like. In some embodiments, the electronic component 30 may further include bonding pads (not shown) configured to receive the first conductor 18 and the second conductor 20. In some embodiments, a reflow operation may be performed. After the substrate 10 and the electronic component 30 are bonded, the height H2' of the second conductor 20 and the height H1' of the first conductor 18 may be substantially the same, and the width W2' of the second conductor 20 may be larger than the width W1' of the first conductor 18. In some embodiments, the second conductor 20 with a larger height may help to avoid cold joint due to warpage or other reasons. In some embodiments, the first conductor 18 with a smaller height may help to avoid bridging (i.e., short circuitry between adjacent conductors) due to warpage or other reasons. In some embodiments, the second conductor 20 may be configured to be formed in a cold joint hot zone where cold joint tends to occur, while the first conductor 18 may be configured to be formed in a bridging hot zone where bridging tends to occur. In some embodiments, the semiconductor device 1 may be a three-dimensional package structure including two or more electronic components or substrates stacked to one another, and the first conductor 18 and the second conductor 20 may be formed in any two of adjacent electronic components or substrates.

The semiconductor device and its manufacturing method of the present disclosure are not limited to the above-mentioned embodiments, and may have other different embodiments. To simplify the description and for the convenience of comparison between each of the embodiments of the present disclosure, the identical components in each of the following embodiments are marked with identical numerals. For making it easier to compare the difference between the embodiments, the following description will detail the dissimilarities among different embodiments and the identical features will not be redundantly described.

Figure 3A:
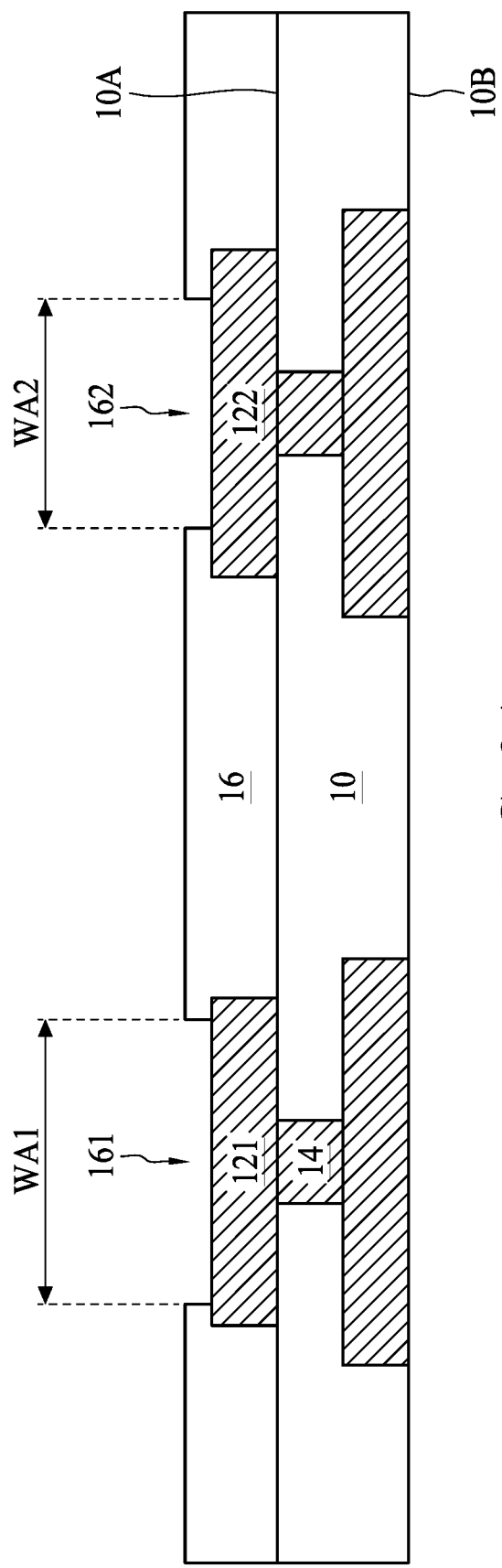
FIG. 3A, FIG. 3B and FIG. 3C are schematic views at one of various operations of manufacturing a semiconductor device according to one or more embodiments of the present disclosure.
Figure 3B:
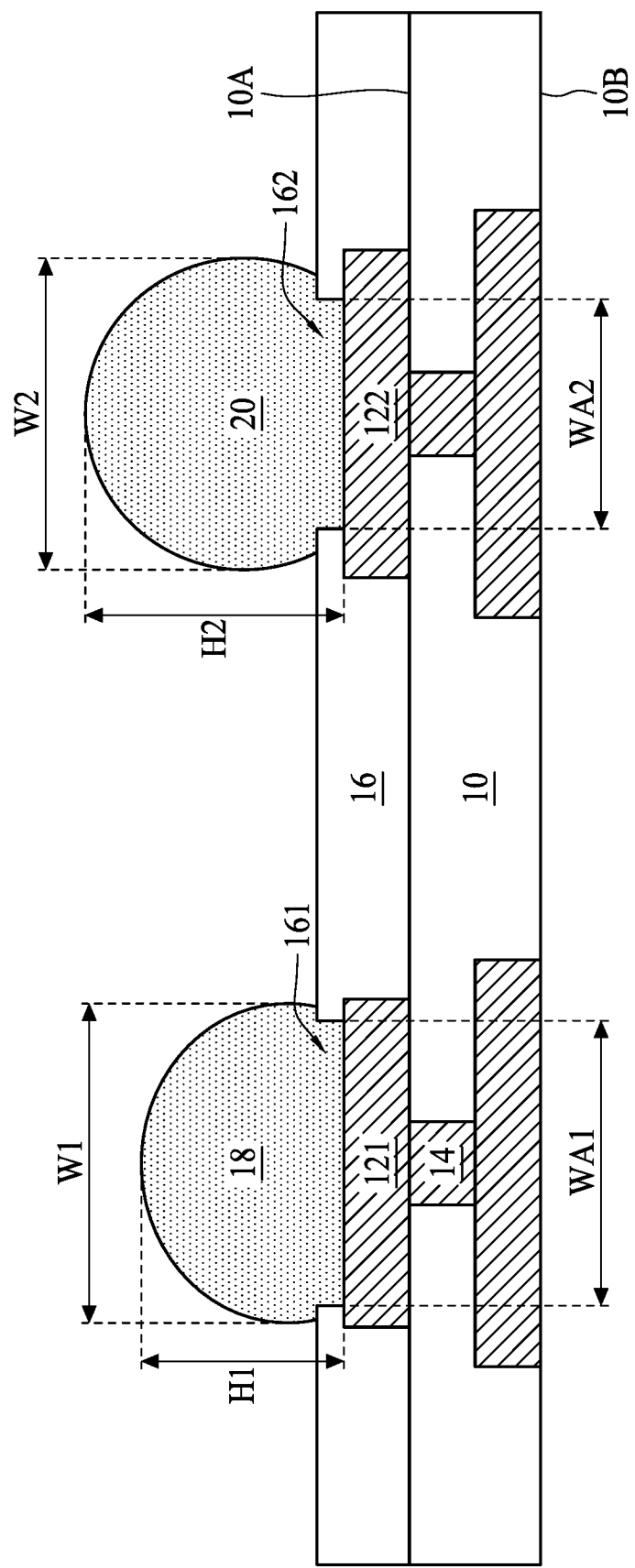
Figure 3C:
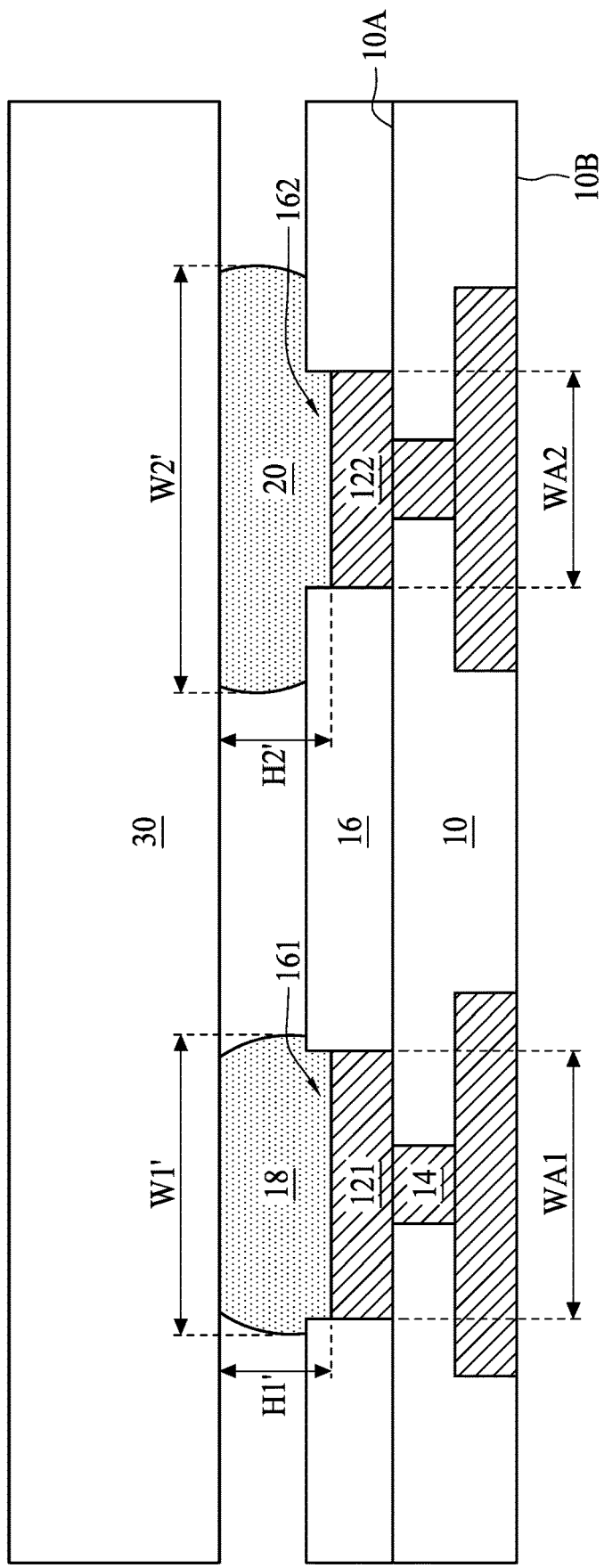

FIG. 3A, FIG. 3B and FIG. 3C are schematic views at one of various operations of manufacturing a semiconductor device according to one or more embodiments of the present disclosure. As depicted in FIG. 3A, a substrate 10 is received. In some embodiments, the substrate 10 may further include a first bonding pad 121 and a second bonding pad 122 exposed from the first surface 10A and configured to receive conductors to be formed. In some alternative embodiments, the first bonding pad 121 and the second bonding pad 122 may be exposed from the second surface 10B. In some embodiments, the substrate 10 may further include one or more circuit layers 14 such as redistribution layers (RDLs), conductive vias or the like electrically connected to the first bonding pad 121 and the second bonding pad 122. In some embodiments, a passivation layer 16 is formed over the substrate 10. In some embodiments, the passivation layer 16 is formed over the first surface 10A of the substrate 10. In some embodiments, the passivation layer 16 may include a solder mask or the like. The passivation layer 16 includes a first recess 161 and a second recess 162 exposing the first bonding pad 121 and the second bonding pad 122, respectively. In some embodiments, the width WA1 of the first recess 161 is larger than the width WA2 of the second recess 162. In some embodiments, the passivation layer 16 covers a portion of the first bonding pad 121 and a portion of the second bonding pad 122.

As depicted in FIG. 3B, a conductive material is formed over the first bonding pad 121 and the second bonding pad 122 to form a first conductor 18 through the first recess 161 and to form a second conductor 20 through the second recess 162. In some embodiments, a reflow operation may be performed after formation of the conductive material. In some embodiments, the passivation layer 16 covering a portion of the first bonding pad 121 may help to define the width W1 of the first conductor 18, and covering a portion of the second bonding pad 122 may help to define the width W2 of the second conductor 20. In some embodiments, the volume of the first conductor 18 and that of the second conductor 20 are substantially the same, the height H1 of the first conductor 18 is defined by the width WA1 of the first recess 161, and the height H2 of the second conductor 20 is defined by the width WA2 of the second recess 162. Since the width WA2 of the second recess 162 is smaller than the width WA1 of the first recess 161, the width W2 of the second conductor 20 is smaller than the width W1 of the first conductor 18, and the height H2 of the second conductor 20 is larger than the height H1 of the first conductor 18. In some embodiments, the height H2 of the second conductor 20 may be larger than the height H1 of the first conductor 18 by about 5% to about 20% e.g., about 10%, but not limited thereto.

As depicted in FIG. 3C, the substrate 10 may be bonded to and electrically connected to an electronic component 30 through the first conductor 18 and the second conductor 20 to form a semiconductor device 2. In some embodiments, a reflow operation may be performed. After the substrate 10 and the electronic component 30 are bonded, the height H2' of the second conductor 20 and the height H1' of the first conductor 18 may be substantially the same, and the width W2' of the second conductor 20 may be larger than the width W1' of the first conductor 18.

Figure 4A:
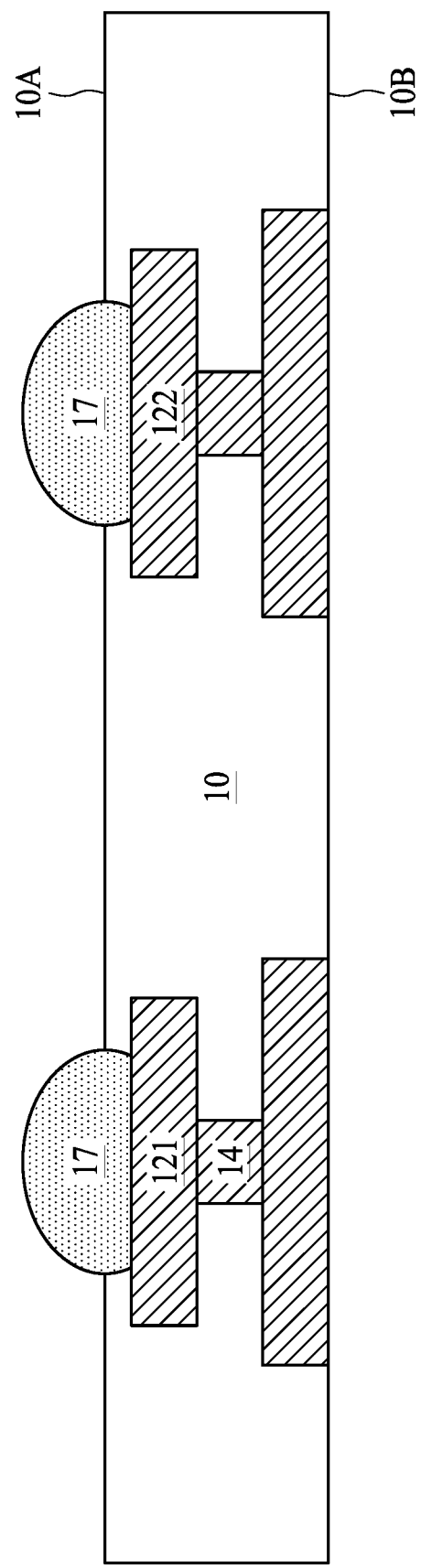
FIG. 4A, FIG. 4B, FIG. 4C, FIG. 4D and FIG. 4E are schematic views at one of various operations of manufacturing a semiconductor device according to one or more embodiments of the present disclosure.

FIG. 4A, FIG. 4B, FIG. 4C, FIG. 4D and FIG. 4E are schematic views at one of various operations of manufacturing a semiconductor device according to one or more embodiments of the present disclosure. As depicted in FIG. 4A, a substrate 10 is received. In some embodiments, the substrate 10 may further include a first bonding pad 121 and a second bonding pad 122 exposed from the first surface 10A, and one or more circuit layers 14 electrically connected to the first bonding pad 121 and the second bonding pad 122. A first conductive material is formed over the first bonding pad 121 and the second bonding pad 122 to form conductors 17 having the same height. In some embodiments, a reflow operation may be performed on the first conductive material to from the conductors 17.

Figure 4B:
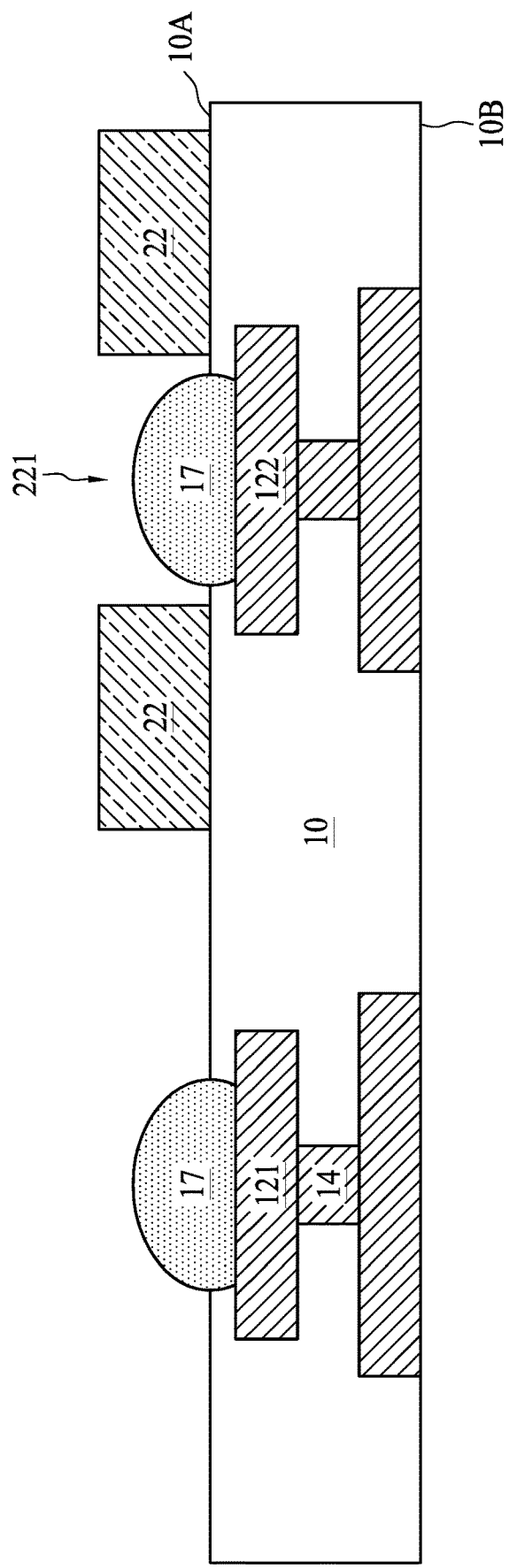
Figure 4C:
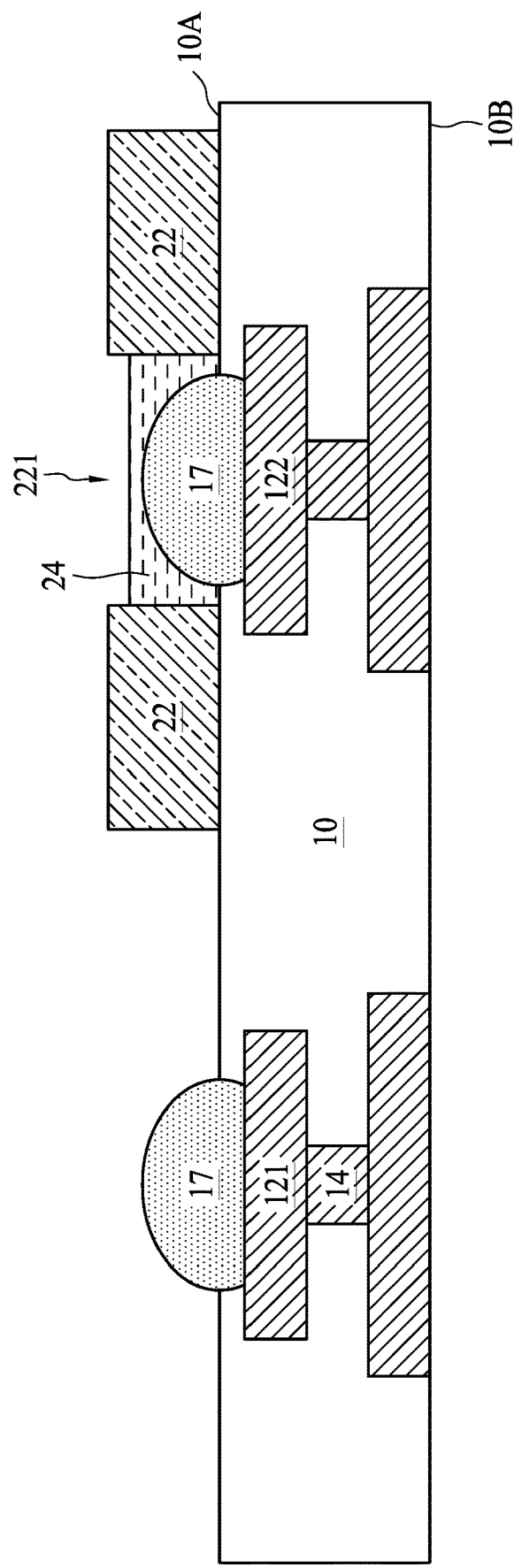

As depicted in FIG. 4B, a patterned mask layer 22 is formed over the substrate 10. The patterned mask layer 22 may include a recess 221 exposing one of the conductors 17. As depicted in FIG. 4C, a second conductive material 24 is formed in the recess 221. In some embodiments, the second conductive material 24 and the first conductive material may include, but is not limited to, different materials. In some embodiments, the melting point of the second conductive material 24 may be lower than that of the first conductive material. By way of examples, the first conductive material may include silver (Ag), copper (Cu), tin (Sn), combinations thereof or the like, and the second conductive material 24 may include lead (Pb), bismuth (Bi), a combination thereof or the like.

Figure 4D:
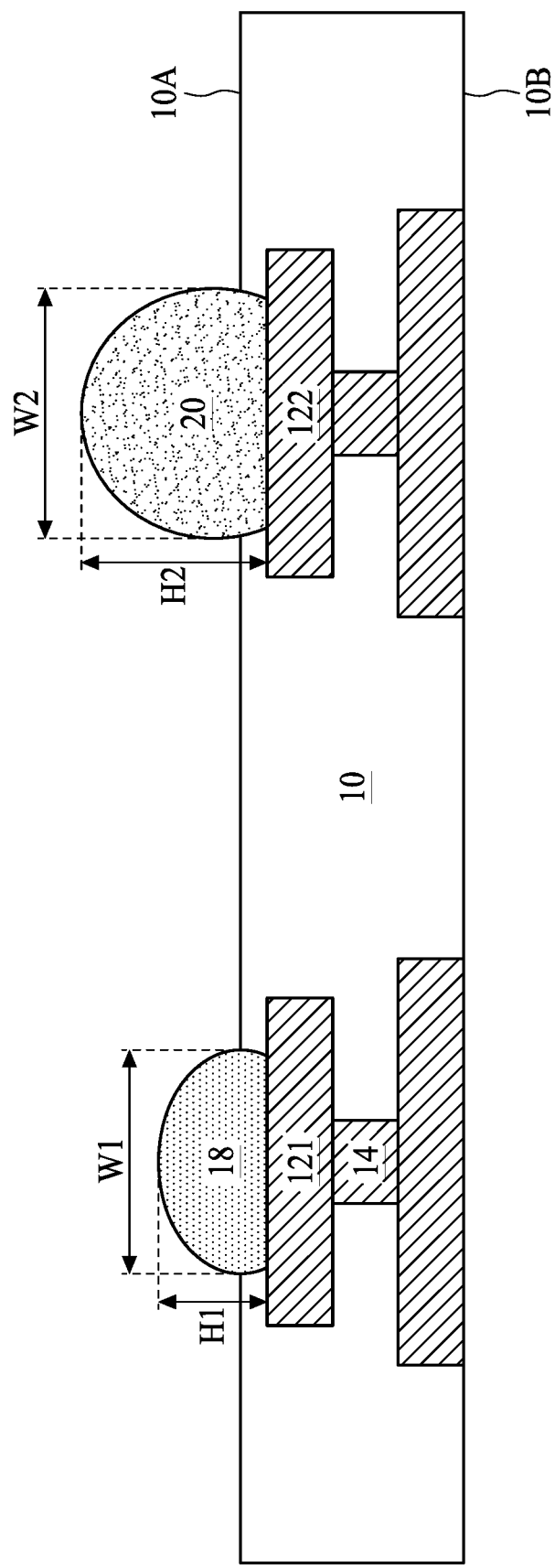

As depicted in FIG. 4D, a reflow operation may be performed on the first conductive material and the second conductive material 24 to form a first conductor 18 having a height H1 and a second conductor 20 having a height H2. The first conductor 18 is formed from the first conductive material, while the second conductor 20 is formed from the first conductive material and the second conductive material 24. Accordingly, the height H2 of the second conductor 20 is larger than the height H1 of the first conductor 18. In some embodiments, the melting point of the second conductor 20 is lower than that of the first conductor 18. In some embodiments, the height H2 of the second conductor 20 may be larger than the height H1 of the first conductor 18 by about 5% to about 20% e.g., about 10%, but not limited thereto. In some embodiments, the width W1 of the first conductor 18 and the width W2 of the second conductor 20 are substantially the same.

Figure 4E:
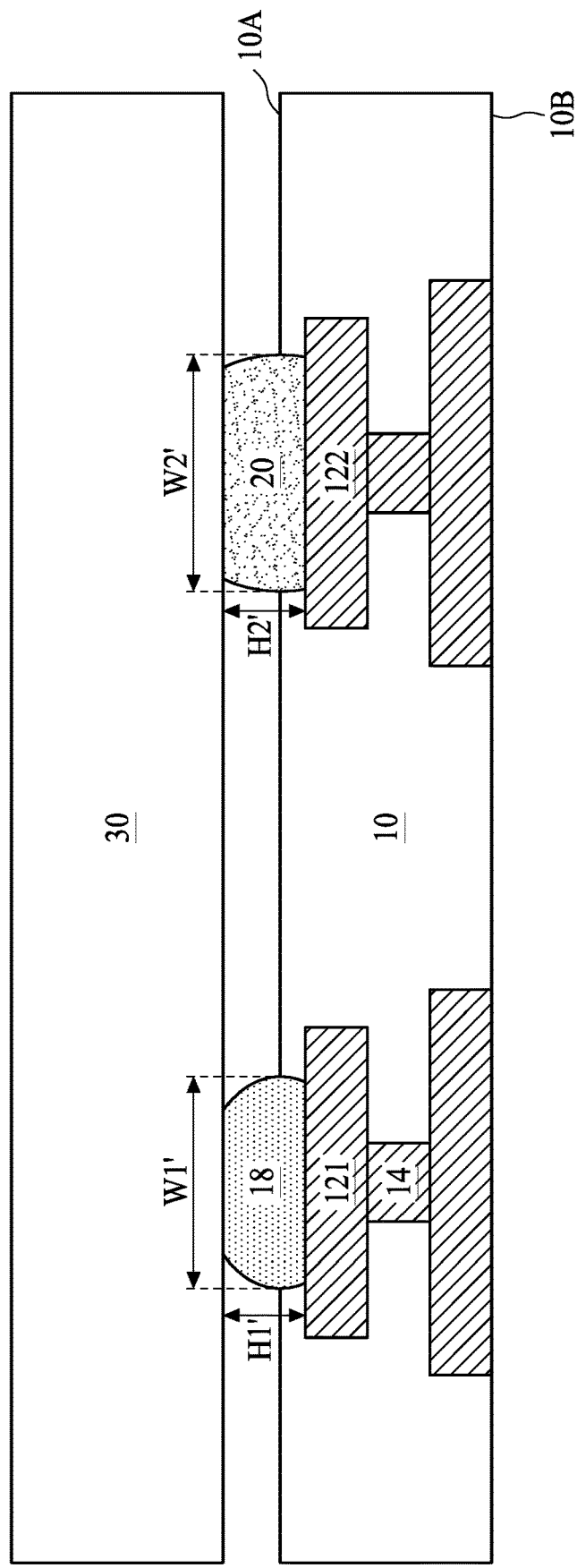

As depicted in FIG. 4E, the substrate 10 may be bonded to and electrically connected to an electronic component 30 through the first conductor 18 and the second conductor 20 to form a semiconductor device 3. In some embodiments, a reflow operation may be performed. After the substrate 10 and the electronic component 30 are bonded, the height H2' of the second conductor 20 and the height H1' of the first conductor 18 may be substantially the same, and the width W2' of the second conductor 20 may be larger than the width W1' of the first conductor 18.

Figure 5A:
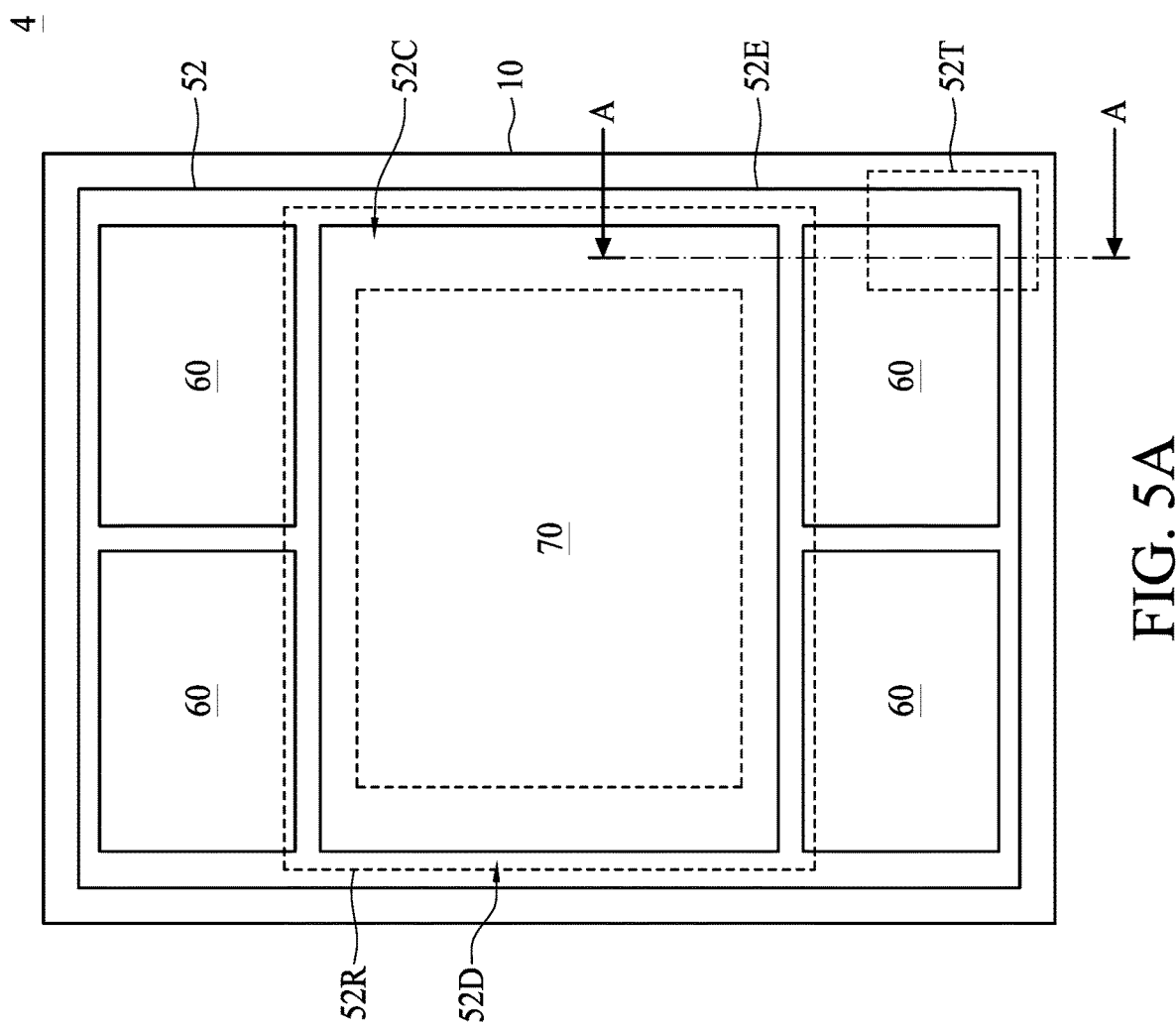
FIG. 5A and FIG. 5B are schematic views of a semiconductor device according to some embodiments of the present disclosure.
Figure 5B:
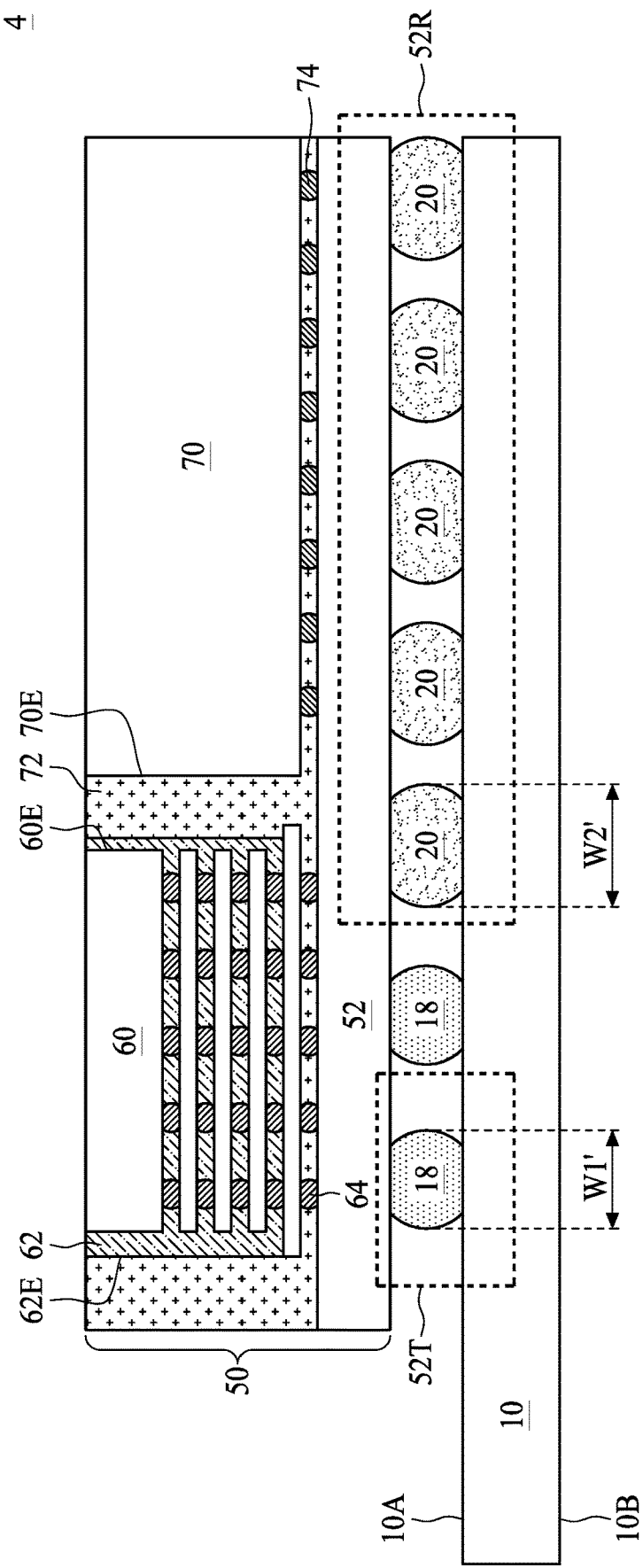

FIG. 5A and FIG. 5B are schematic views of a semiconductor device according to some embodiments of the present disclosure, where FIG. 5A is a top view of a semiconductor device according to some embodiments of the present disclosure, and FIG. 5B is a cross-sectional view along a line A-A of a semiconductor device of FIG. 5A. As depicted in FIG. 5A and FIG. 5B, the semiconductor device 4 includes a substrate 10, a package 50, first conductors 18 and second conductors 20. The package 50 is disposed over the substrate 10. The first conductors 18 and the second conductors 20 are disposed over the substrate 10 and electrically connected to the package 50. In some embodiments, the package 50, the first conductors 18 and the second conductors 20 are disposed over the first surface 10A of the substrate 10, and the first conductors 18 and the second conductors 20 are disposed between the package 50 and the first surface 10A of the substrate 10. In some embodiments, the width W2' of the second conductor 20 is larger than the width W1' of first conductor 18. The volume of the second conductor 20 may be substantially equal to or larger than the volume of the first conductor 18. In some embodiments, the first conductors 18 and the second conductors 20 may be formed by e.g., the methods described in the aforementioned embodiments, but not limited thereto.

In some embodiments, the package 50 may include, but is not limited to, a chip-on-wafer (CoW) structure. In some embodiments, the package 50 may include an interposer 52, at least one first semiconductor die 60, at least one second semiconductor die 70, a first molding layer 62 and a second molding layer 72. The first semiconductor die 60 is disposed over and electrically connected to the interposer 52. In some embodiments, the first semiconductor die 60 is electrically connected to the interposer 52 through conductive structures 64 such as conductive bumps, conductive balls, conductive pastes or the like. The second semiconductor die 70 is disposed over and electrically connected to the interposer 52, and the second semiconductor die 70 is disposed adjacent to the at least one first semiconductor die 60. In some embodiments, the second semiconductor die 70 is electrically connected to the interposer 52 through conductive structures 74 such as conductive bumps, conductive balls, conductive pastes or the like. In some embodiments, the first semiconductor die 60 and the second semiconductor die 70 include different types of dies having different characteristics. By way of example, the first semiconductor die 60 may include memory die(s), and the second semiconductor die 70 may include system on chip (SOC) die(s). In some embodiments, the first semiconductor die 60 was packaged with the first molding layer 62 surrounding sidewalls 60E of the first semiconductor die 60 before disposing over the interposer 52, while the second semiconductor die 70 is packaged after disposing over the interposer 52. The second molding layer 72 is disposed over the interposer 52 and surrounds sidewalls 70E of the second semiconductor die 70 and sidewalls 62E of the first molding layer 62. In some embodiments, the characteristics of the first molding layer 62 and the second molding layer 72 are different. By way of example, the first molding layer 62 and the second molding layer 72 may include different materials with different coefficients of thermal expansion (CTEs).

In some embodiments, the second conductors 20 are formed in a cold joint hot zone 52R where cold joint tends to occur. For example, the second conductors 20 are substantially aligned to a boundary 52C between the at least one first semiconductor die 60 and the at least one second semiconductor die 70, and substantially aligned to a boundary 52D between the at least one second semiconductor die 70 and an edge 52E of the interposer 52. In some embodiments, the first conductors 18 are formed in a bridging hot zone 52T where bridging tends to occur. For example, the first conductors 18 may be aligned to corners of the interposer 52.

Figure 6A:
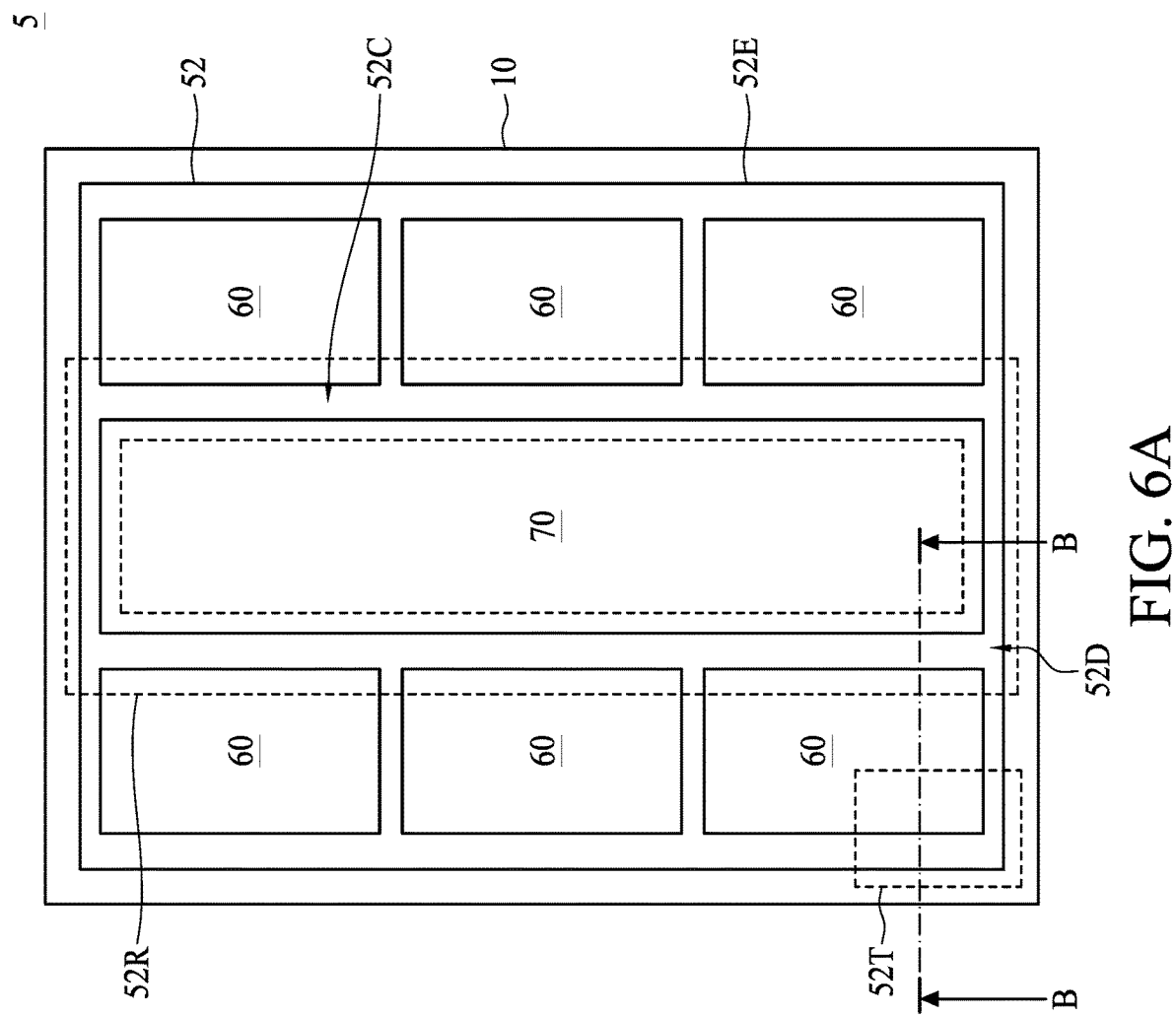
FIG. 6A and FIG. 6B are schematic views of a semiconductor device according to some embodiments of the present disclosure.
Figure 6B:
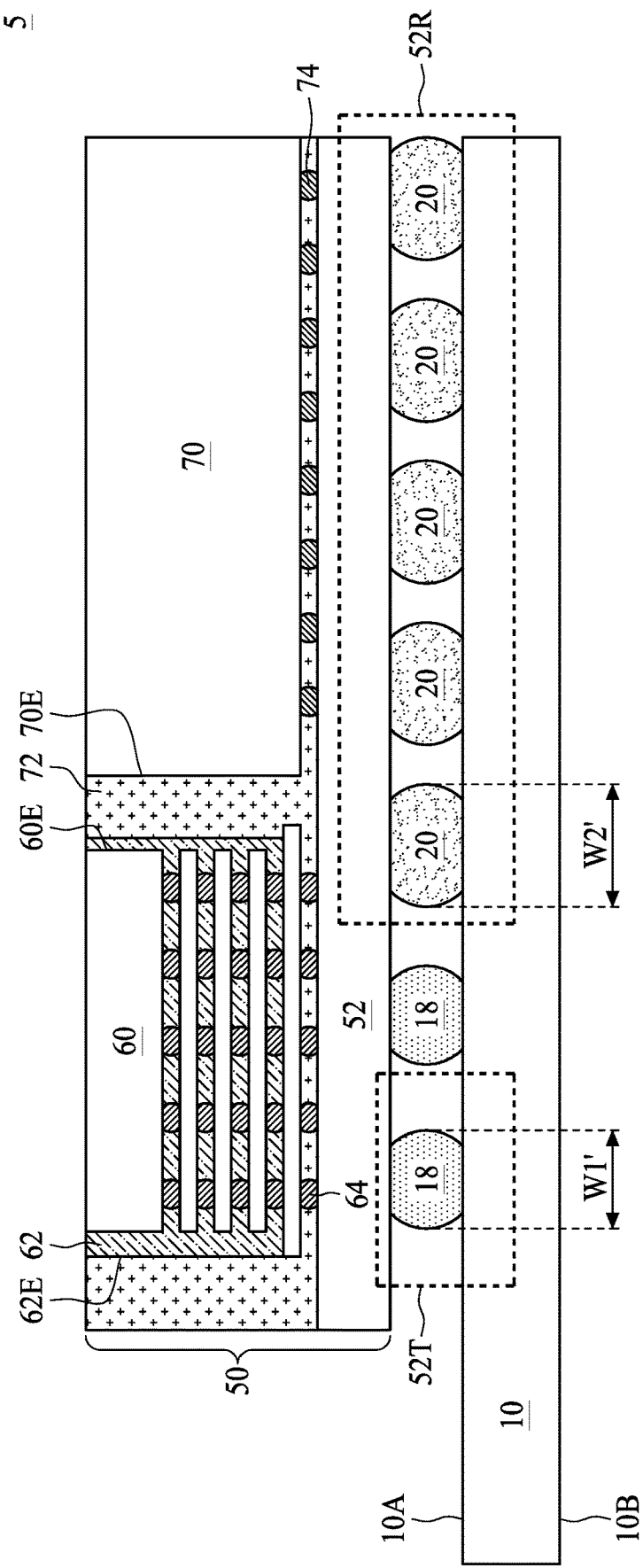

FIG. 6A and FIG. 6B are schematic views of a semiconductor device according to some embodiments of the present disclosure, where FIG. 6A is a top view of a semiconductor device according to some embodiments of the present disclosure, and FIG. 6B is a cross-sectional view along a line B-B of a semiconductor device of FIG. 6A. As depicted in FIG. 6A and FIG. 6B, the first semiconductor dies 60 and the second semiconductor dies 70 of the semiconductor device 5 are arranged in a different configuration. The second conductors 20 may be arranged in a cold joint hot zone 52R different from that in FIG. 5A and FIG. 5B to avoid cold joint. The first conductors 18 may be arranged in a bridging hot zone 52T different from that in FIG. 5A and FIG. 5B to avoid bridging.

Figure 7A:
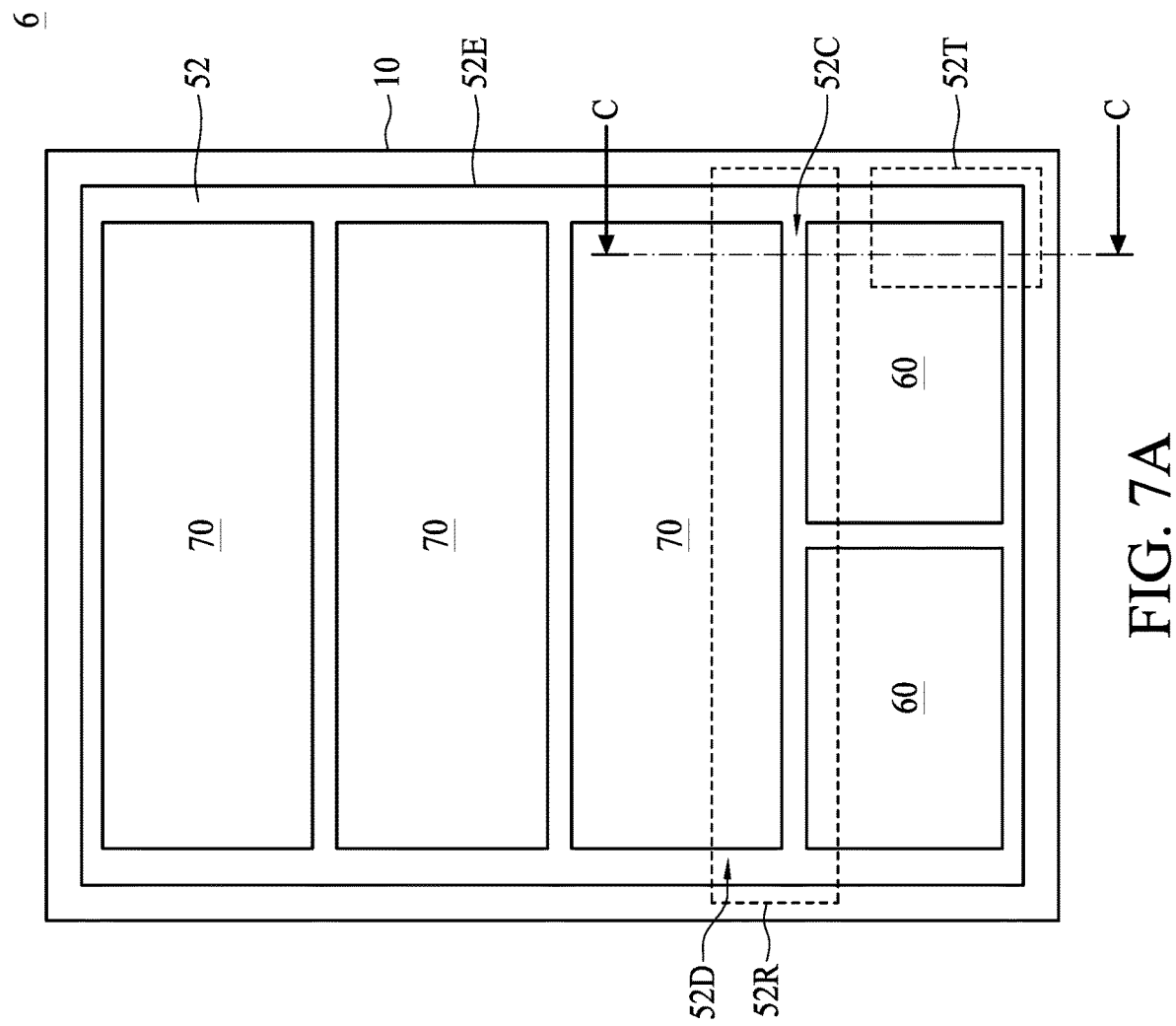
FIG. 7A and FIG. 7B are schematic views of a semiconductor device according to some embodiments of the present disclosure.
Figure 7B:
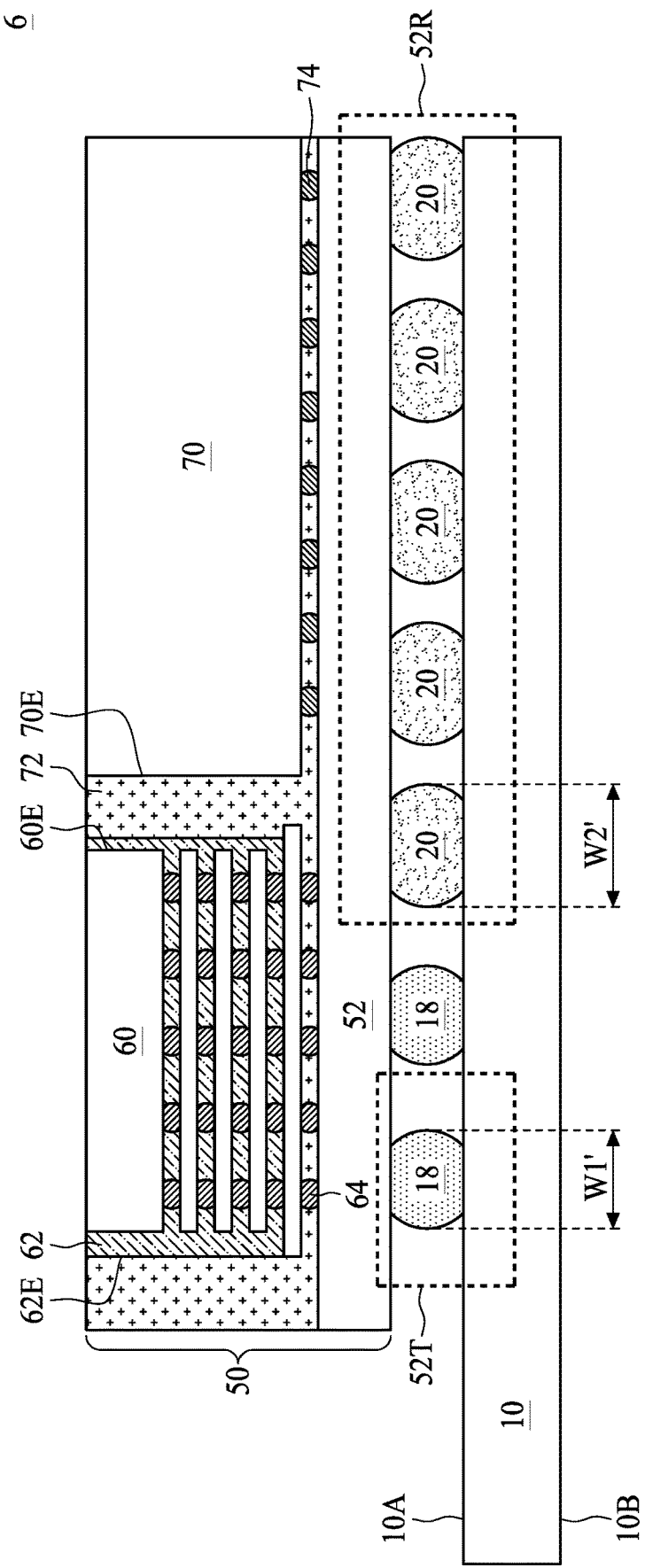

FIG. 7A and FIG. 7B are schematic views of a semiconductor device according to some embodiments of the present disclosure, where FIG. 7A is a top view of a semiconductor device according to some embodiments of the present disclosure, and FIG. 7B is a cross-sectional view along a line C-C of a semiconductor device of FIG. 7A. As depicted in FIG. 7A and FIG. 7B, the first semiconductor dies 60 and the second semiconductor dies 70 of the semiconductor device 6 are arranged in a different configuration. The second conductors 20 may be arranged in a cold joint hot zone 52R different from that in FIG. 5A and FIG. 5B or that in FIG. 6A and FIG. 6B to avoid cold joint. The first conductors 18 may be arranged in a bridging hot zone 52T different from that in FIG. 5A and FIG. 5B or that in FIG. 6A and FIG. 6B to avoid bridging.

Figure 8:
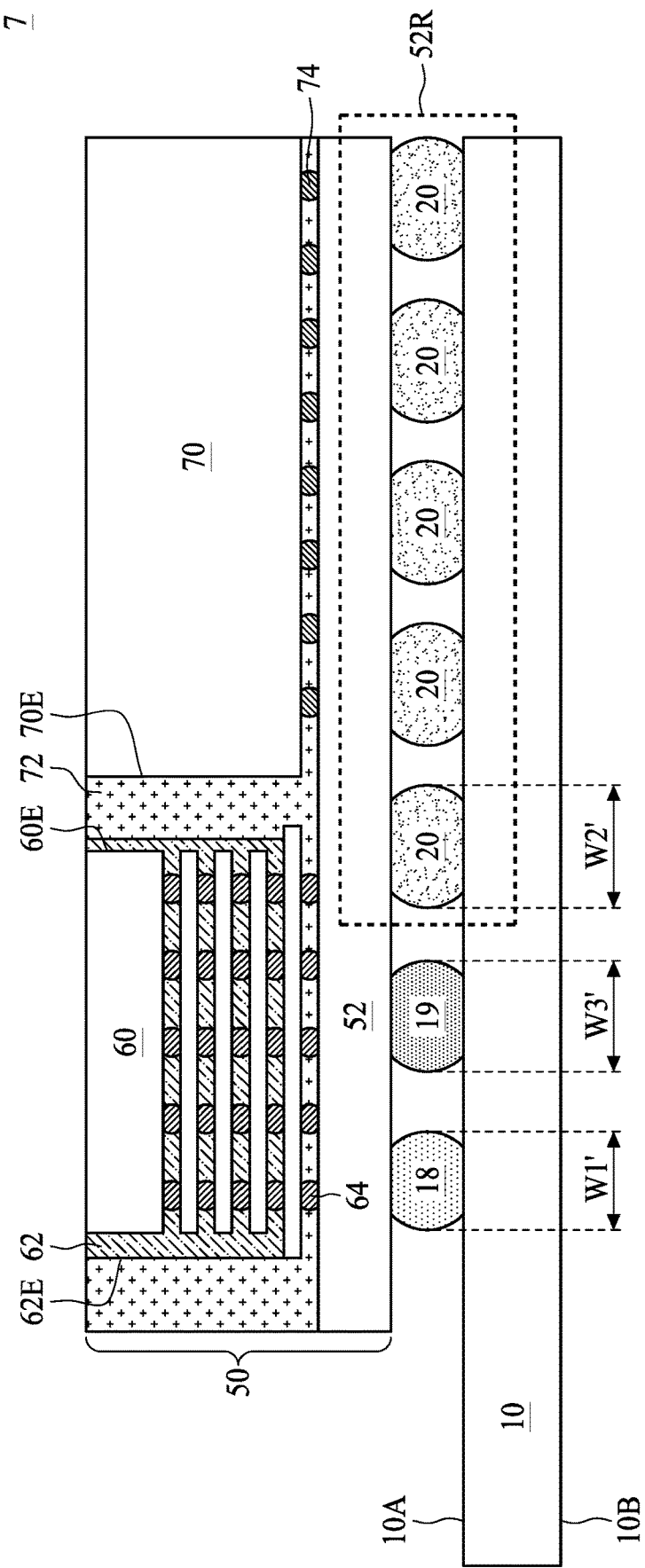
FIG. 8 is a schematic view of a semiconductor device according to some embodiments of the present disclosure.

FIG. 8 is a schematic view of a semiconductor device according to some embodiments of the present disclosure. As depicted in FIG. 8, the semiconductor device 7 may further include one or more third conductors 19 disposed between the first conductors 18 and the second conductors 20, and a width W3' of the third conductor 19 is between the width W1' of the first conductor 18 and the width W2' of the second conductor 20. In some embodiments, the first conductors 18, the second conductors 20 and the third conductors 19 are substantially disposed at the same tier i.e. at the same level. In some embodiments, the semiconductor device 7 may include three or more types of conductors having different widths. By way of examples, the widths of conductors may be gradually decreased from the cold joint hot zone to the bridging hot zone.

Figure 9A:
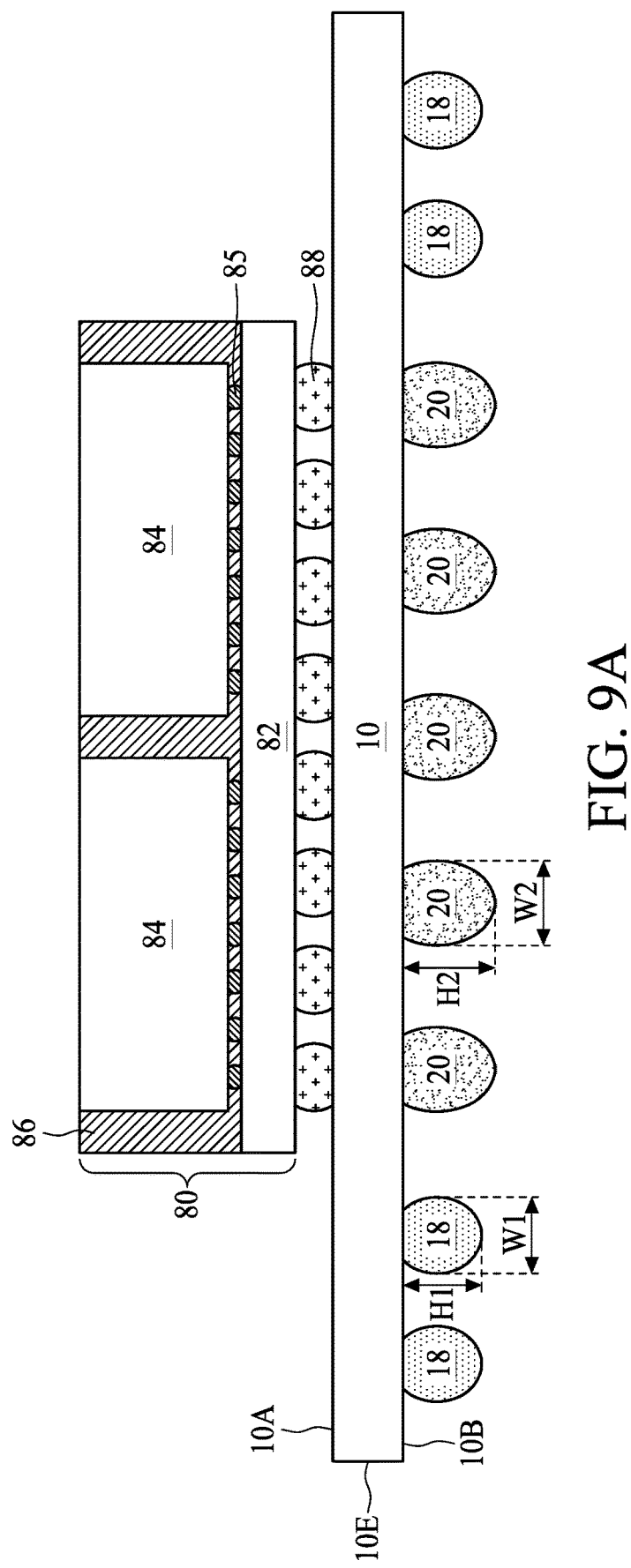
FIG. 9A, FIG. 9B, FIG. 9C and FIG. 9D are schematic views at one of various operations of manufacturing a semiconductor device according to one or more embodiments of the present disclosure.
Figure 9B:
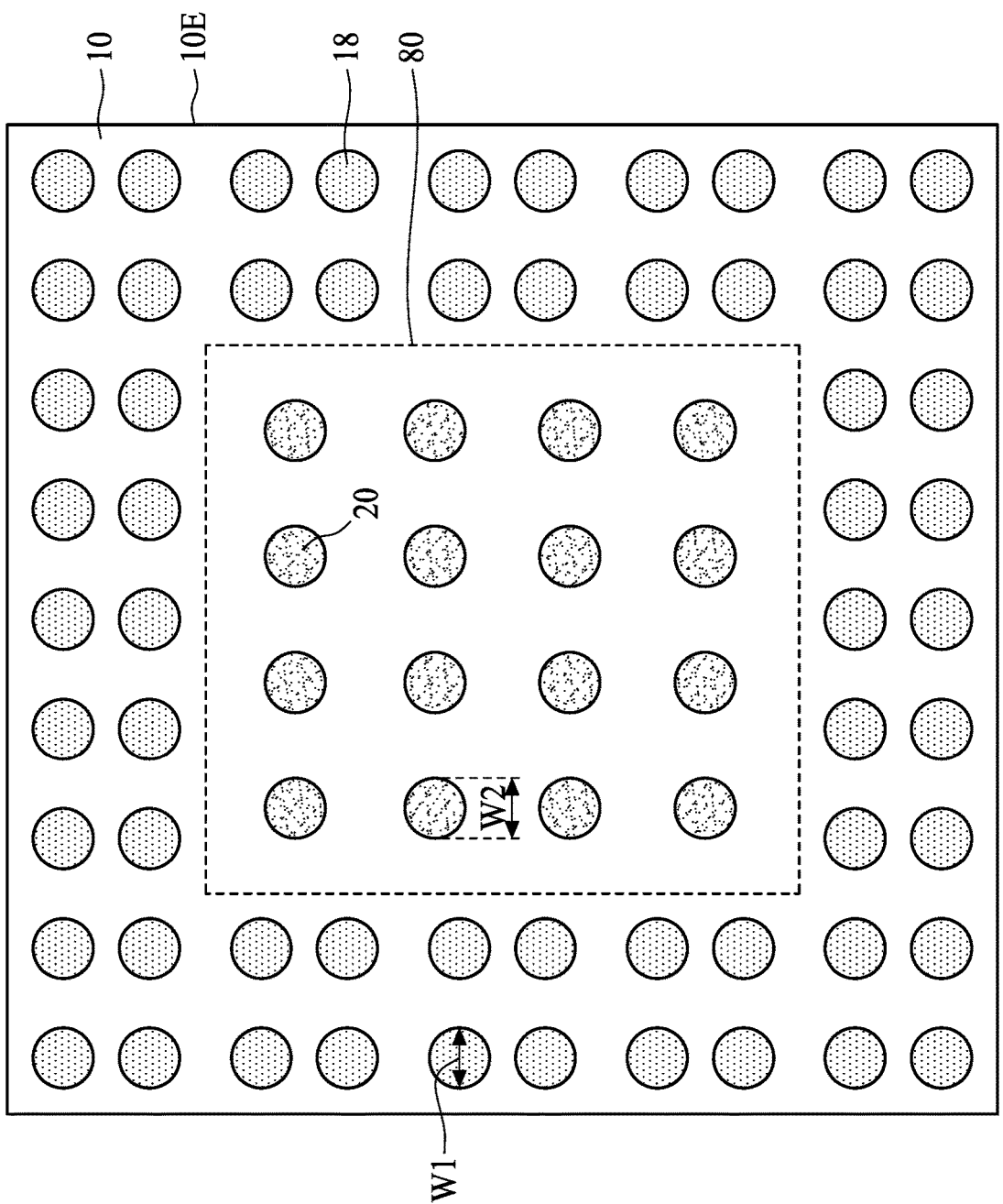

FIG. 9A, FIG. 9B, FIG. 9C and FIG. 9D are schematic views at one of various operations of manufacturing a semiconductor device according to one or more embodiments of the present disclosure. As depicted in FIG. 9A and FIG. 9B, a substrate 10 including a first surface 10A and a second surface 10B opposite to the first surface 10A is received. A package 80 is formed over the first surface 10A of the substrate 10. In some embodiments, the package 80 includes an interposer 82, one or more semiconductor dies 84 over and electrically connected to the interposer 82 through conductive structures 85, and a molding layer 86 covering the semiconductor die(s) 84. The package 80 may further includes conductive structures 88 between the interposer 82 and the substrate 10, and electrically connected to the interposer 82 and the substrate 10. In some embodiments, the package 80 is disposed over the first surface 10A of the substrate 10. The first conductors 18 and second conductors 20 are formed over the substrate 10 and electrically connected to the package 80. In some embodiments, the first conductors 18 and the second conductors 20 are formed over the second surface 10B of the substrate 10. In some embodiments, the volume of the second conductor 20 is larger than the volume of the first conductor 18. In some embodiments, the width W2 of the second conductor 20 is substantially equal to width W1 of the first conductor 18. In some embodiments, the height H2 of the second conductor 20 is larger than the height H1 of the first conductor 18. In some embodiments, the first conductors 18 and the second conductors 20 may be formed by e.g., the methods described in the aforementioned embodiments, but not limited thereto. In some embodiments, the second conductors 20 are under the package 80, and the first conductors 18 are proximal to an edge 10E of the substrate.

Figure 9C:
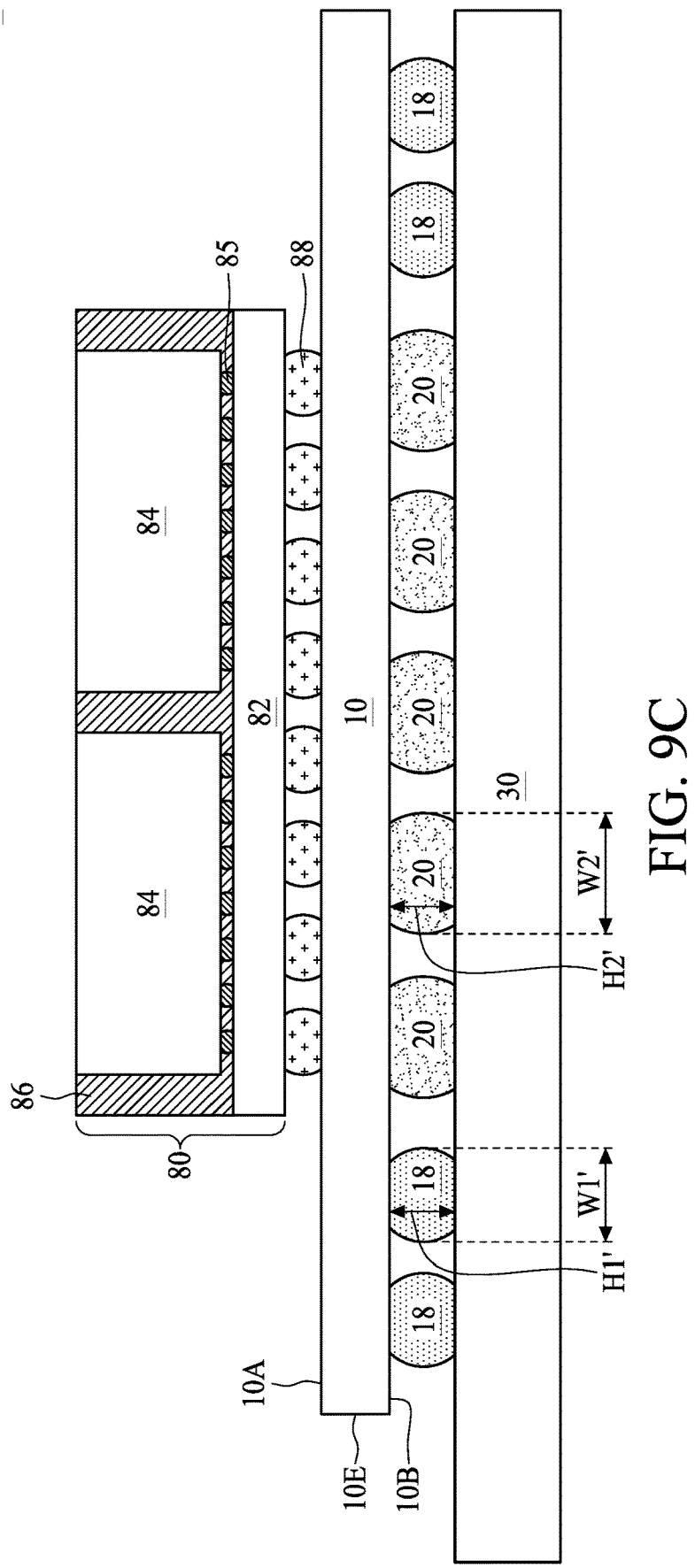
Figure 9D:
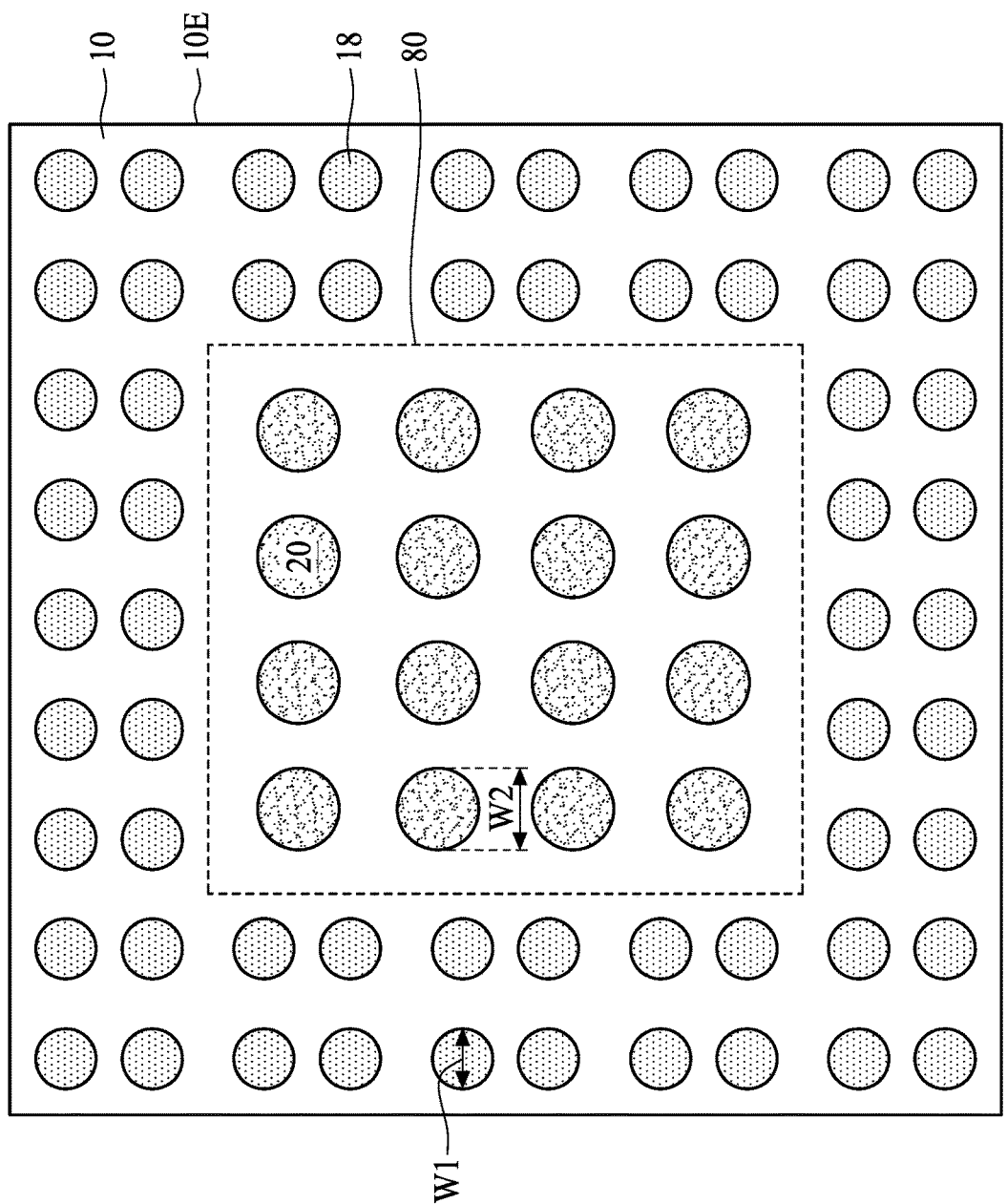

As depicted in FIG. 9C and FIG. 9D, the substrate 10 is bonded to and electrically connected to an electronic component 30 through the first conductors 18 and the second conductors 20 to form a semiconductor device 8. In some embodiments, the electronic component 30 may include a printed circuit board (PCB) or the like, and the semiconductor device 8 may include a chip-on-wafer-on-substrate (CoWoS) structure. After the substrate 10 and the electronic component 30 are bonded, the height H2' of the second conductor 20 and the height H1' of the first conductor 18 may be substantially the same, and the width W2' of the second conductor 20 may be larger than the width W1' of the first conductor 18. In some embodiments, the second conductor 20 with a larger height may help to avoid cold joint due to warpage or other reasons. In some embodiments, the first conductor 18 with a smaller height may help to avoid bridging (i.e., short circuitry between adjacent conductors) due to warpage or other reasons. In some embodiments, the second conductor 20 may be configured to be formed in a cold joint hot zone where cold joint tends to occur, while the first conductor 18 may be configured to be formed in a bridging hot zone where bridging tends to occur. In some embodiments, the semiconductor device 8 may be a three-dimensional package structure including two or more electronic components or substrates stacked to one another, and the first conductor 18 and the second conductor 20 may be formed in any two of adjacent electronic components or substrates.

Figure 10:
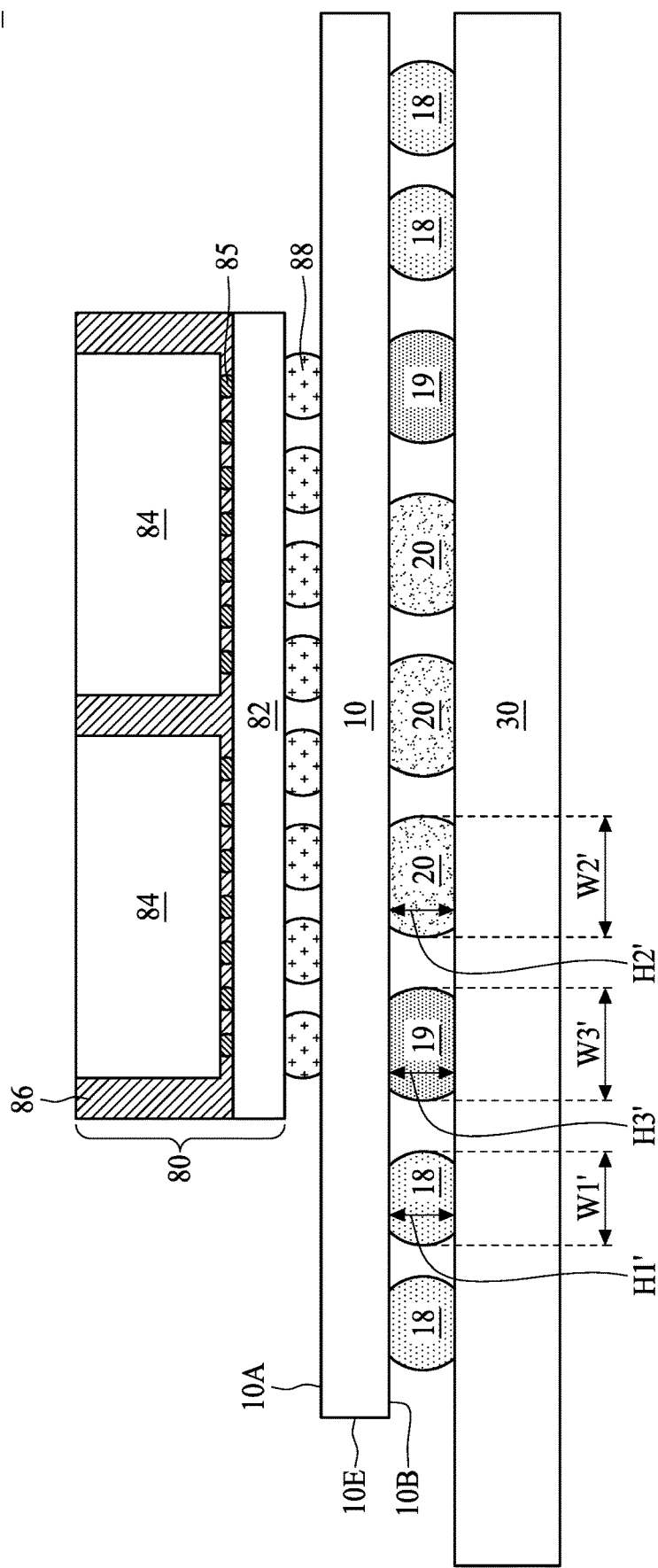
FIG. 10 is a schematic view of a semiconductor device according to some embodiments of the present disclosure.

FIG. 10 is a schematic view of a semiconductor device according to some embodiments of the present disclosure. As depicted in FIG. 10, the semiconductor device 9 may further include one or more third conductors 19 disposed between the first conductors 18 and the second conductors 20, and a width W3' of the third conductor 19 is between the width W1' of the first conductor 18 and the width W2' of the second conductor 20. In some embodiments, the height H2' of the second conductor 20, the height H1' of the first conductor 18 and a height H3' of the third conductor 19 may be substantially the same. In some embodiments, the semiconductor device 9 may include three or more types of conductors having different widths. By way of examples, the widths of conductors may be gradually decreased from a center of the substrate 10 to an edge of the substrate 10.

In some embodiments of the present disclosure, two or more types of conductors having different volumes and/or heights are formed at different regions of a substrate to respectively alleviate cold joint issue and bridging issue due to warpage or other reasons. The two or more types of conductors may have substantially the same height after the substrate is bonded to an electronic component, but they can alleviate cold joint issue and bridging issue during manufacturing of the semiconductor device. The different widths of the conductors may be controlled by modifying volumes or compositions of respective conductors, using solder mask having recesses of different widths, modifying widths of respective bonding pads or the like.

In one exemplary aspect, a semiconductor device includes a substrate, a package, a plurality of first conductors and a plurality of second conductors. The substrate includes a first surface and a second surface opposite to the first surface. The package is over the first surface of the substrate. The first conductors are on the second surface of the substrate. The second conductors are on the second surface of the substrate. The first conductors and the second conductors are substantially at a same tie. A width of a second conductor of the plurality of second conductors is larger than a width of a first conductor of the plurality of first conductors. The substrate is between the package and the plurality of first conductors, and between the package and the plurality of second conductors.

In another aspect, a semiconductor device includes a substrate, a package and a plurality of first conductors and second conductors. The package is over the substrate. The package comprising an interposer, a first molding layer over the interposer, and a second molding layer over the interposer, wherein the first molding layer and the second molding layer have different characteristics. The first conductors and second conductors are between the substrate and the interposer, wherein a width of a second conductor of the plurality of second conductors is larger than a width of a first conductor of the plurality of first conductors. A portion of the plurality of second conductors are substantially aligned to a boundary between the first molding layer and the second molding layer.

In yet another aspect, a semiconductor device includes an electronic component, a package, a substrate and a plurality of first conductors and second conductors. The package is over the electronic component. T substrate is between the electronic component and the package. The substrate includes a first portion covered by the package, and a second portion protruding out of an edge of the package and uncovered by the package. The first conductors and second conductors are between and electrically connected to the electronic component and the substrate. A width of a second conductor of the plurality of second conductors is larger than a width of a first conductor of the plurality of first conductors, the first conductors are disposed between the second portion of the substrate and the electronic component, and the second conductors are disposed between the first portion of the substrate and the electronic component.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device, comprising:
a substrate including a first surface and a second surface opposite to the first surface;
a package over the first surface of the substrate;
a plurality of first conductors on the second surface of the substrate;

a plurality of second conductors on the second surface of the substrate; and a plurality of third conductors over the second surface of the substrate, wherein the plurality of first conductors, the plurality of second conductors and the plurality of third conductors are substantially at a same tier and have substantially the same height, a width of a second conductor of the plurality of second conductors is larger than a width of a first conductor of the plurality of first conductors, the substrate is between the package and the plurality of first conductors, and between the package and the plurality of second conductors, and a width of a third conductor of the plurality of third conductors is between the width of the first conductor and the width of the second conductor, wherein the first conductors, the second conductors and the third conductors each comprises a curved sidewall profile.

2. The semiconductor device of claim 1, wherein a volume of a second conductor of the plurality of second conductors is substantially equal to a volume of a first conductor of the plurality of first conductors.

3. The semiconductor device of claim 1, wherein a volume of a second conductor of the plurality of second conductors is larger than a volume of a first conductor of the plurality of first conductors.

4. The semiconductor device of claim 1, wherein the plurality of second conductors are disposed under the package, and the plurality of first conductors are proximal to edges of the substrate.

5. The semiconductor device of claim 4, wherein the plurality of third conductors are disposed between the plurality of first conductors and the plurality of second conductors.

6. The semiconductor device of claim 1, wherein the package comprises a first molding layer of and a second molding layer, the first molding layer and the second molding layer include different materials, and at least a portion of the plurality of second conductors are substantially aligned to a boundary between the first molding layer and the second molding layer.

7. A semiconductor device, comprising:

a substrate;

a package over the substrate, the package comprising an interposer, a first molding layer over the interposer, and a second molding layer over the interposer, wherein the first molding layer and the second molding layer have different characteristics; and a plurality of first conductors and second conductors between the substrate and the interposer, wherein a width of a second conductor of the plurality of second conductors is larger than a width of a first conductor of the plurality of first conductors, wherein a portion of the plurality of second conductors are substantially aligned to a boundary between the first molding layer and the second molding layer.

8. The semiconductor device of claim 7, wherein the first molding layer and the second molding layer have coefficients of thermal expansion (CTEs).

9. The semiconductor device of claim 7, wherein the package further comprises a first semiconductor die and a second semiconductor die over the interposer, edges of the first semiconductor die is surrounded by the first molding layer, and edges of the second semiconductor die is surrounded by the second molding layer.

10. The semiconductor device of claim 9, wherein the first semiconductor die and the second semiconductor die comprise different types of dies having different characteristics.

11. The semiconductor device of claim 10, wherein the first semiconductor die comprises a memory die, and the second semiconductor die comprises a system on chip (SOC) die.

12. The semiconductor device of claim 9, wherein a portion of the plurality of second conductors are substantially aligned to a boundary between the first semiconductor die and the second semiconductor die.

13. The semiconductor device of claim 12, wherein another portion of the plurality of second conductors are substantially aligned to edges of the interposer.

14. The semiconductor device of claim 9, wherein a portion of the plurality of first conductors are substantially aligned to corners of the interposer.

15. The semiconductor device of claim 7, wherein the plurality of first conductors and the plurality of the second conductors are substantially at a same tier.

16. A semiconductor device, comprising:

an electronic component;

a package over the electronic component;

a substrate between the electronic component and the package, wherein the substrate includes a first portion covered by the package, and a second portion protruding out of an edge of the package and uncovered by the package; and a plurality of first conductors and second conductors between and electrically connected to the electronic component and the substrate, wherein a width of a second conductor of the plurality of second conductors is larger than a width of a first conductor of the plurality of first conductors, the first conductors are disposed between the second portion of the substrate and the electronic component, and the second conductors are disposed between the first portion of the substrate and the electronic component.

17. The semiconductor device of claim 16, wherein the plurality of second conductors are surrounded by the plurality of first conductors.

18. The semiconductor device of claim 16, wherein the plurality of first conductors and the plurality of the second conductors are substantially at a same tier.

19. The semiconductor device of claim 16, further comprising a plurality of third conductors between and electrically connected to the electronic component and the substrate, wherein a width of a third conductor of the plurality of third conductors is between the width of the first conductor and the width of the second conductor.

20. The semiconductor device of claim 19, wherein the plurality of third conductors are between the plurality of first conductors and the plurality of second conductors.

* * * * *